US012685185B2

(12) United States Patent
Chang et al.

(10) Patent No.: US 12,685,185 B2
(45) Date of Patent: Jul. 14, 2026

(54) SEMICONDUCTOR DEVICE WITH LEADFRAME SPACER AND METHOD THEREFOR

(71) Applicant: NXP B.V., Eindhoven (NL)

(72) Inventors: Yao Jung Chang, Kaohsiung (TW); Tzu Ya Fang, Tainan City (TW); Yu Ling Tsai, Kaohsiung City (TW); Jian Nian Chen, Kosiiung City (TW); Yen-Chih Lin, Hsinchu City (TW)

(73) Assignee: NXP B.V., Eindhoven (NL)

( * ) Notice: Subject to any disclaimer, the term of this patent is extended or adjusted under 35 U.S.C. 154(b) by 451 days.

(21) Appl. No.: 18/342,809

(22) Filed: Jun. 28, 2023

(65) Prior Publication Data

US 2025/0006598 A1    Jan. 2, 2025

(51) Int. Cl.
| | |
|---|---|
| *H10W 70/40* | (2026.01) |
| *H10W 42/00* | (2026.01) |
| *H10W 70/04* | (2026.01) |
| *H10W 72/00* | (2026.01) |
| *H10W 74/01* | (2026.01) |
| *H10W 74/10* | (2026.01) |
| *H10W 90/00* | (2026.01) |

(52) U.S. Cl.
CPC ....... *H10W 70/424* (2026.01); *H10W 42/121* (2026.01); *H10W 70/047* (2026.01); *H10W 74/01* (2026.01); *H10W 74/111* (2026.01); *H10W 72/884* (2026.01); *H10W 90/736* (2026.01); *H10W 90/756* (2026.01)

(58) Field of Classification Search
CPC ........................ H01L 23/4954; H01L 21/4839
See application file for complete search history.

(56) References Cited

U.S. PATENT DOCUMENTS

| | | | | |
|---|---|---|---|---|
| 6,184,575 | B1 * | 2/2001 | Chillara | H10W 74/114 |
| | | | | 257/E23.125 |
| 7,777,309 | B2 * | 8/2010 | Danno | H03F 3/189 |
| | | | | 257/784 |
| 8,207,600 | B2 * | 6/2012 | Bathan | H10W 74/016 |
| | | | | 257/670 |
| 8,513,680 | B2 * | 8/2013 | Kim | H10H 20/856 |
| | | | | 257/676 |
| 8,551,820 | B1 * | 10/2013 | Foster | H10W 74/111 |
| | | | | 257/784 |
| 8,633,062 | B2 * | 1/2014 | Punzalan | H10W 70/424 |
| | | | | 257/667 |
| 9,847,281 | B2 * | 12/2017 | Talledo | H10W 70/421 |
| 11,244,889 | B2 * | 2/2022 | Yasuda | H10W 70/424 |
| 11,462,467 | B2 * | 10/2022 | Huang | H10W 70/424 |
| 11,676,885 | B2 * | 6/2023 | Chang | H10W 70/417 |
| | | | | 257/676 |
| 2011/0089547 | A1 * | 4/2011 | Holloway | H10W 70/40 |
| | | | | 257/676 |

(Continued)

*Primary Examiner* — Dale E Page
*Assistant Examiner* — Rohit Parthasarathy

(57) ABSTRACT

A method of manufacturing a semiconductor device is provided. The method includes affixing a spacer structure to a bottom side of a plurality of leads of a leadframe. A semiconductor die is attached to a top side of a die pad of the leadframe. The semiconductor die, the leadframe, and the spacer structure are encapsulated with an encapsulant. Portions of the spacer structure and portions of the leads of the plurality of leads are exposed at a bottom side of the encapsulant.

16 Claims, 7 Drawing Sheets

(56)         References Cited

U.S. PATENT DOCUMENTS

| | | | |
|---|---|---|---|
| 2012/0104579 A1* | 5/2012 | Do | H10W 74/111 |
| | | | 257/670 |
| 2013/0256861 A1* | 10/2013 | Do | H10W 74/00 |
| | | | 257/676 |
| 2013/0285222 A1* | 10/2013 | Park | H10W 70/04 |
| | | | 257/676 |
| 2018/0068932 A1* | 3/2018 | Talledo | H10W 70/421 |
| 2022/0020680 A1* | 1/2022 | Huang | H10W 70/424 |
| 2022/0359350 A1* | 11/2022 | Chang | H10W 70/417 |

* cited by examiner

SEMICONDUCTOR DEVICE WITH LEADFRAME SPACER AND METHOD THEREFOR

FIELD

This disclosure relates generally to semiconductor devices, and more specifically, to semiconductor device with leadframe spacer and method of forming the same.

RELATED ART

Semiconductor devices are often found in a large spectrum of electronic products—from sewing machines to washing machines, from automobiles to cellular telephones, and so on. Many of these semiconductor devices are produced in high volumes to drive costs down while serving large markets. Factors such as manufacturing processes may be optimized for product costs but could adversely affect product performance and reliability. As technology progresses, semiconductor manufacturing continues to seek ways to improve performance and reliability in these semiconductor devices while keeping product costs in focus.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a semiconductor device having a leadframe spacer structure. The leadframe includes a die pad and surrounding long half-etched leads. The half-etched leads have a full thickness outer portion and a reduced thickness inner portion. The spacer structure is attached at a bottom side of the inner portion of the leads by way of an adhesive material. The reduced thickness inner portion of the leads with the attached spacer structure has a total thickness substantially equal to the thickness of the full thickness outer portion. The spacer structure is formed from a non-conductive, rigid material and configured to support the long half-etched leads during a wire bonding operation, for example. A semiconductor die is attached at the top side of the die pad. Bond pads of the semiconductor die are connected to the inner portions of the leads by way of a bond wires. An encapsulant encapsulates the semiconductor die, the leadframe, and the spacer structure. A bottom surface of the full thickness outer portions of the leads and a bottom surface of the spacer structure are coplanar and exposed at a bottom side of the encapsulant. By forming the semiconductor device with the spacer structure attached to the inner portion of the long half-etched leads in this manner, the long half-etch leads are reinforced and supported during manufacturing operations (e.g., wire bonding) allowing for improved overall yields and greater reliability.

Figure 1:
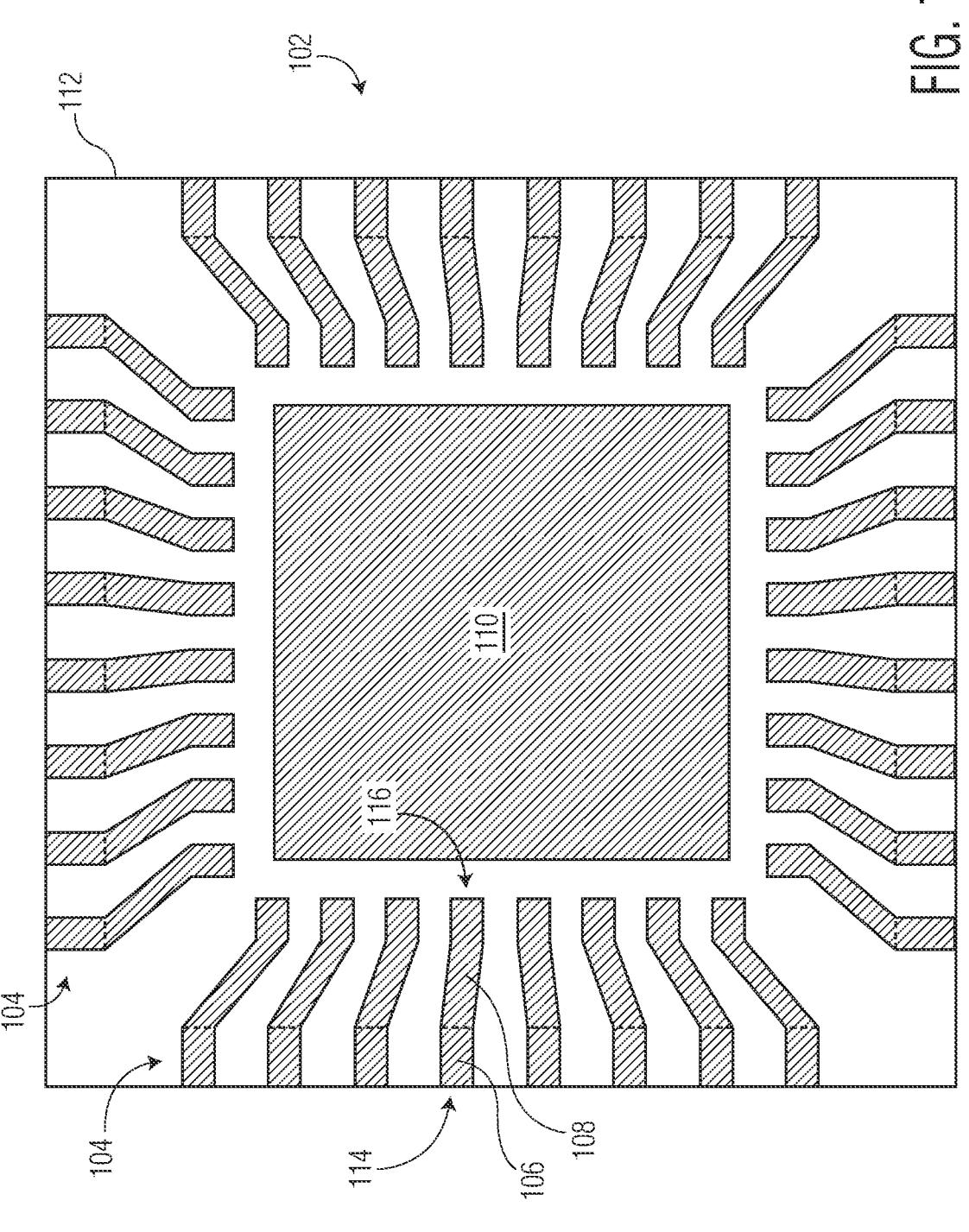
FIG. 1 illustrates, in a simplified plan view, an example semiconductor device having a leadframe spacer structure at a stage of manufacture in accordance with an embodiment.

FIG. 1 illustrates, in a simplified bottom-side-up plan view, an example semiconductor device 100 having a leadframe spacer structure at a stage of manufacture in accordance with an embodiment. At this stage, the semiconductor device 100 includes a leadframe 102 shown in a bottom-side-up orientation. In this embodiment, the leadframe 102 includes a plurality of conductive leads 104 surrounding a conductive die pad 110. The term "conductive," as used herein, generally refers to electrical conductivity unless otherwise described. Each lead of the plurality of leads 104 has an outer end 114 proximate to an outer perimeter 112 and an inner end 116 proximate to the die pad 110. The outer perimeter 112 of the leadframe 102 depicts an outer perimeter location of a singulated package encapsulant at a subsequent stage of manufacture, for example. Portions of the leadframe 102 outside of the outer perimeter 112 such as dam bars interconnected to the plurality of leads 104 and the like are not shown for illustration purposes. The size and shape of the outer perimeter 112 of the semiconductor device 100 along with the location and number of the leads 104 in this embodiment are chosen for illustration purposes. In this embodiment, the leadframe 202 may be characterized as a leadframe configured for a quad flat no-lead (QFN) type package. In other embodiments, the leadframe may be configured for other package types.

Each lead of the plurality of leads 104 includes an outer full thickness portion 106 proximate to the outer end 114 at outer perimeter 112 and an inner half-etched, reduced thickness portion 108 extending from the outer full thickness portion to the inner end 116 proximate to the die pad 110. As depicted in FIG. 1, the outer portion 106 of leads 104 extends from the outer end 114 at outer perimeter 112 to the dashed line and the inner portion 108 extends from the dashed lined to the inner end 116. The inner half-etched, reduced thickness portion 108 is etched from the bottom side to reduce the lead thickness. The leadframe 102 may be formed from any suitable metal materials, such as copper, nickel, aluminum, iron, or alloys thereof, for example. The leadframe 102 may be bare, partially plated, or plated with another metal or an alloy such as silver, gold, palladium, and the like. The term "half-etched," as used herein, refers to a method of selectively reducing the thickness of portions of the leads by a predetermined amount.

Figure 2:
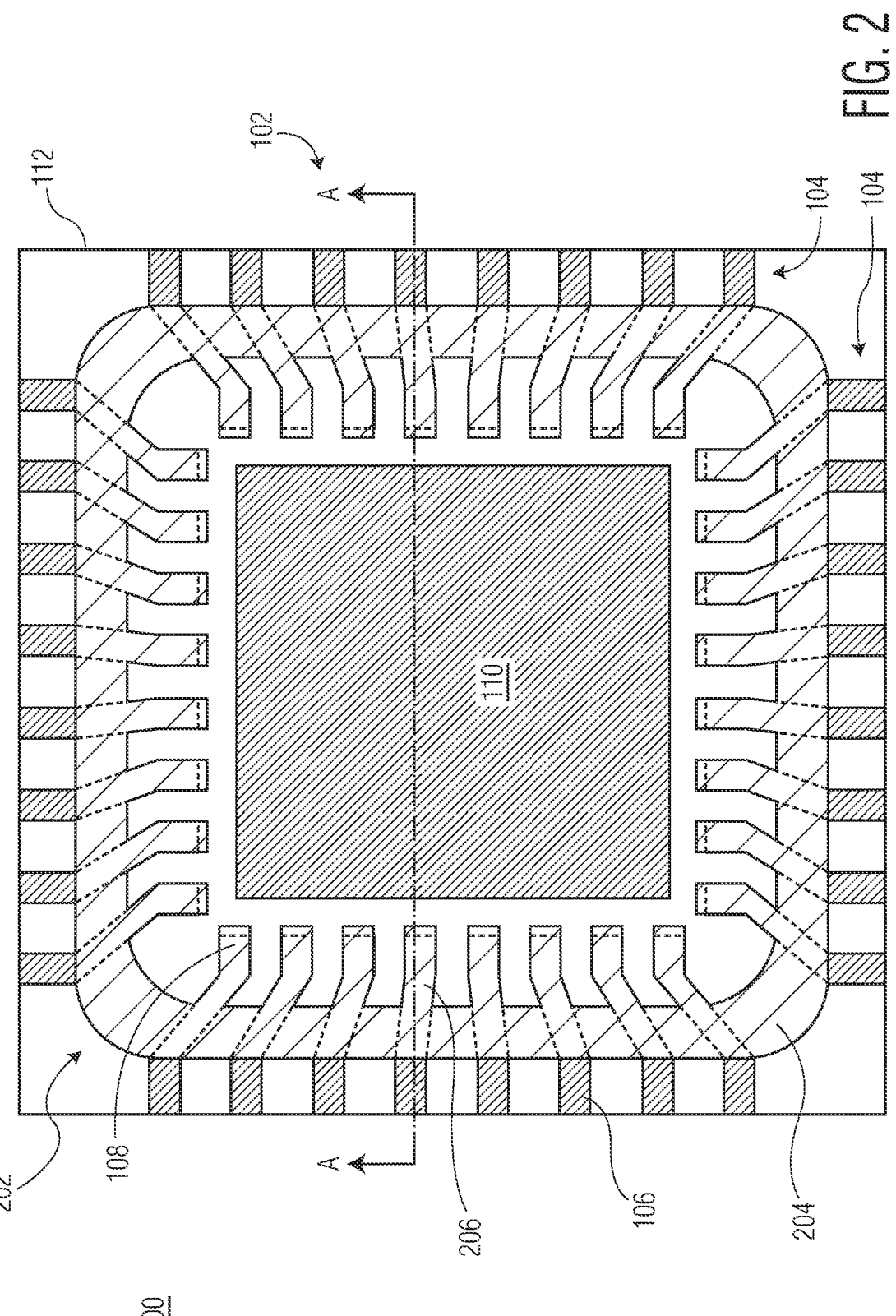
FIG. 2 illustrates, in a simplified plan view, the example semiconductor device at a subsequent stage of manufacture in accordance with an embodiment.

FIG. 2 illustrates, in a simplified bottom-side-up plan view, the example semiconductor device 100 at a subsequent stage of manufacture in accordance with an embodiment. At this stage, the semiconductor device 100 includes a non-conductive, substantially rigid spacer structure 202 affixed on portions of the leads 104 of the leadframe 102. In this embodiment, the spacer structure 202 includes a ring portion 204 and a plurality of finger portions 206. The spacer structure 202 is attached to the inner portions 108 of the leads 104 of the leadframe 102 by way of an adhesive material (not shown). The spacer structure 202 may be formed from suitable non-conductive, rigid materials such as prepreg, bismaleimide triazine (BT), Ajinomoto build up film (ABF), and the like. In some embodiments, the spacer structure 202 may be further formulated to include one or more suitable materials to attain desired mechanical properties such as coefficient of thermal expansion (CTE). Simplified cross-sectional views of the example semiconductor device 100 taken along line A-A are shown at stages of manufacture depicted in FIG. 3 through FIG. 6.

Figure 3:
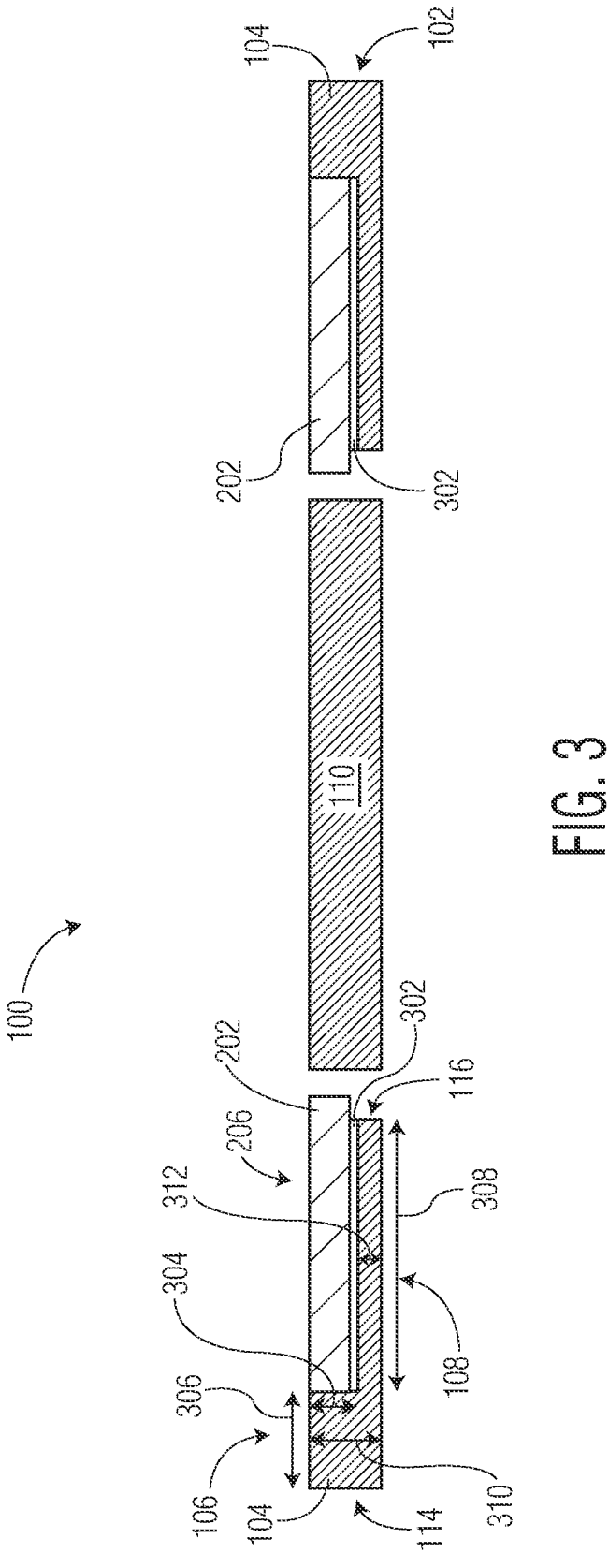
FIG. 3 through FIG. 6 illustrate, in simplified cross-sectional views, the example semiconductor device at stages of manufacture in accordance with an embodiment.

FIG. 3 illustrates, in a simplified bottom-side-up cross-sectional view, the example semiconductor device 100 taken along line A-A at the stage of manufacture depicted in FIG. 2 in accordance with an embodiment. At this stage, the semiconductor device 100 depicted in FIG. 3 includes the spacer structure 202 affixed on portions of the leads 104 of the leadframe 102. In this embodiment, the spacer structure 202 is attached at the bottom side of the inner half-etched, reduced thickness portion 108 of the leads 104 by way of the non-conductive adhesive material 302. The leads 104 as depicted in FIG. 3 have an outer end 114 and an inner end 116. Each of leads 104 includes an outer portion 106 and an inner portion 108. The outer portion 106 is proximate to the outer end 114 and is characterized as a full-thickness portion having a thickness 310 and a length 306. The inner portion 108 extends from the outer portion to the inner end 116 and is characterized as a half-etched, reduced thickness portion 108 having a thickness 312 and a length 308. In this embodiment, the ring portion 204 of the spacer structure 202 is configured to provide an interconnecting backbone to the finger portions 206. The ring portion 204 of the spacer structure 202 is positioned proximate to the outer portions 106 of the leads 104 and the finger portions 206 of the spacer structure 202 are positioned proximate to the inner ends 116 of the leads 104.

In this embodiment, the inner portion 108 of the leads 104 is selectively etched to remove material (e.g., metal) from the bottom side to reduce the lead thickness by a predetermined amount 304. For example, it may be desirable to reduce the lead thickness by a predetermined amount 304 equal to the thickness of the finger portion 206 of the spacer structure 202 plus the thickness of the adhesive material 302 such that the bottom surface of the spacer structure 202 and the bottom surface of the outer portion 106 of the leads 104 are substantially coplanar. In this embodiment, the leads 104 may be characterized as long half-etched leads having the length 308 of the reduced thickness portion 108 being longer than the length 306 of the full-thickness portion 106.

Figure 4:
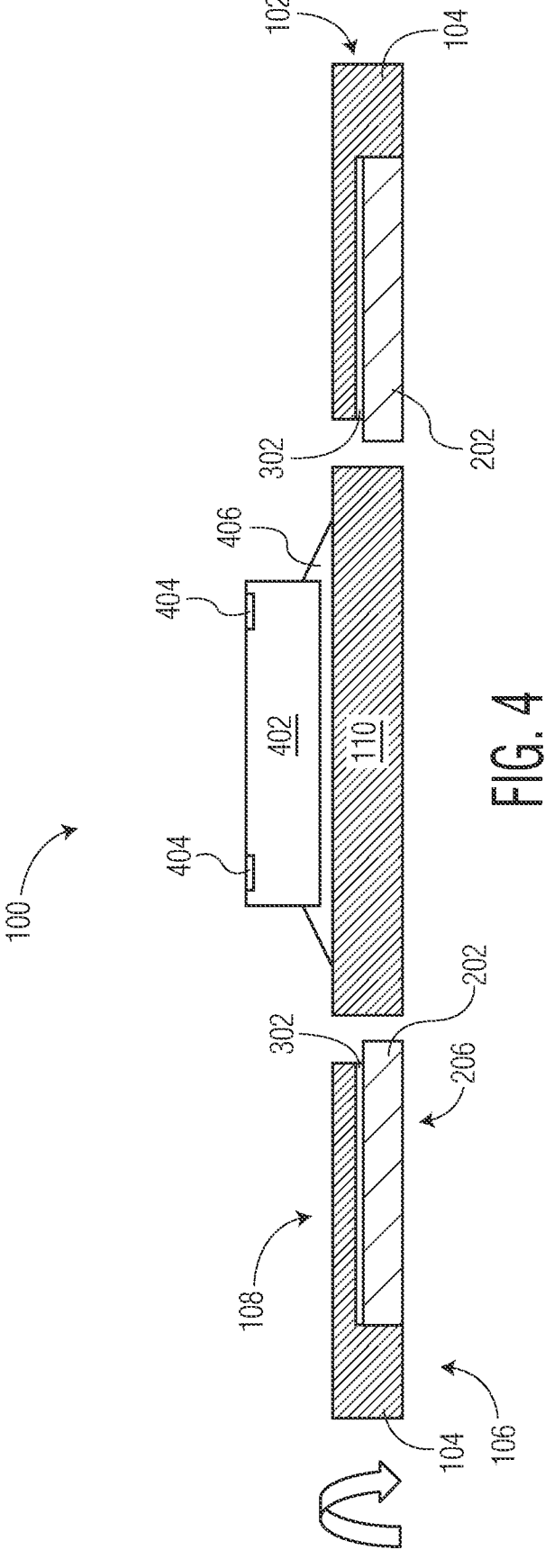

FIG. 4 illustrates, in a simplified cross-sectional view, the example semiconductor device 100 at a subsequent stage of manufacture in accordance with an embodiment. At this stage, the semiconductor device 100 depicted in FIG. 4 is oriented (flipped) top-side-up and a semiconductor die 402 is mounted on the die pad 110 of the leadframe 102. In this embodiment, a backside of the semiconductor die 402 is attached to the top surface of the die pad 110 by way of a die attach material 406. The die attach material 406 may be a paste, film, or solder material, for example.

The semiconductor die 402 has an active side (e.g., major side having circuitry, bond pads) and a backside (e.g., major side opposite of the active side). As depicted in the cross-sectional view of FIG. 4, the semiconductor die 402 is mounted on the die pad 110 in an active-side-up orientation, for example. The semiconductor die 402 includes bond pads 404 located at the active side of the semiconductor die and configured for connection to the leads 104. The semiconductor die 402 may be formed from any suitable semiconductor material, such as silicon, germanium, gallium arsenide, gallium nitride, and the like. The semiconductor die 402 may further include any digital circuits, analog circuits, RF circuits, memory, processor, sensor, the like, and combinations thereof at the active side.

Figure 5:
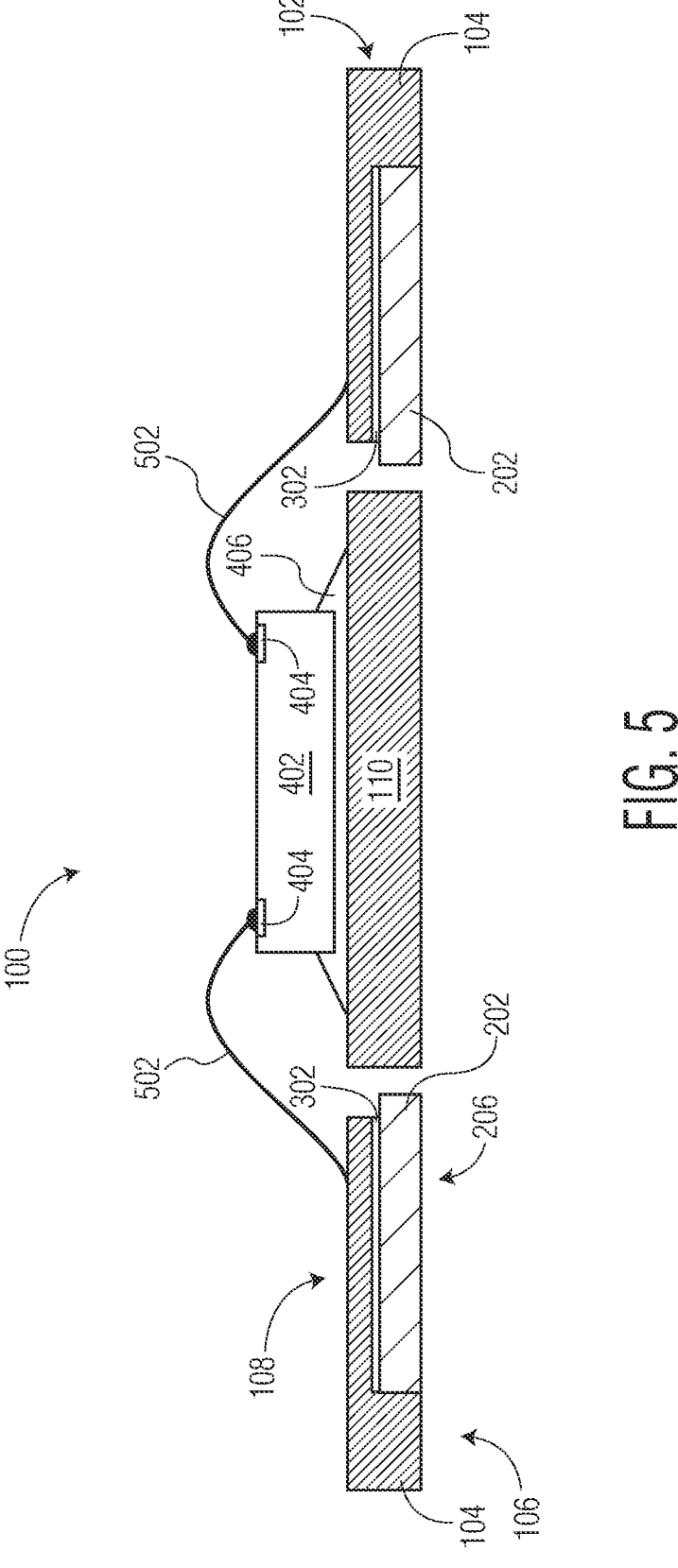

FIG. 5 illustrates, in a simplified cross-sectional view, the example semiconductor device 100 at a subsequent stage of manufacture in accordance with an embodiment. At this stage, the semiconductor device 100 depicted in FIG. 5 includes the bond pads 404 of the semiconductor die 402 interconnected to leads 104 by way of bond wires 502. In this embodiment, a first end of the bond wires 502 is attached to the bond pads 404 by way of a first bond (e.g., ball bond) and a second end of the bond wires 502 is attached to a bonding region at the top surface of the reduced thickness portion 108 of the leads 104 by way of a second bond (e.g., stitch bond). The bonding region may be characterized as general location at the top surface of the reduced thickness portion 108 proximate to the die pad 110. In this embodiment, the boding region at the top surface of the reduced thickness portion 108 of the leads 104 directly overlaps the underlying finger portions 206 of the spacer structure 202. Because the spacer structure 202 is attached to the bottom side of the reduced thickness portion 108 of the leads 104, the bonding region at the top surface of the leads 104 is sufficiently supported (e.g., eliminating lead flex) during a wire bonding operation.

Figure 6:
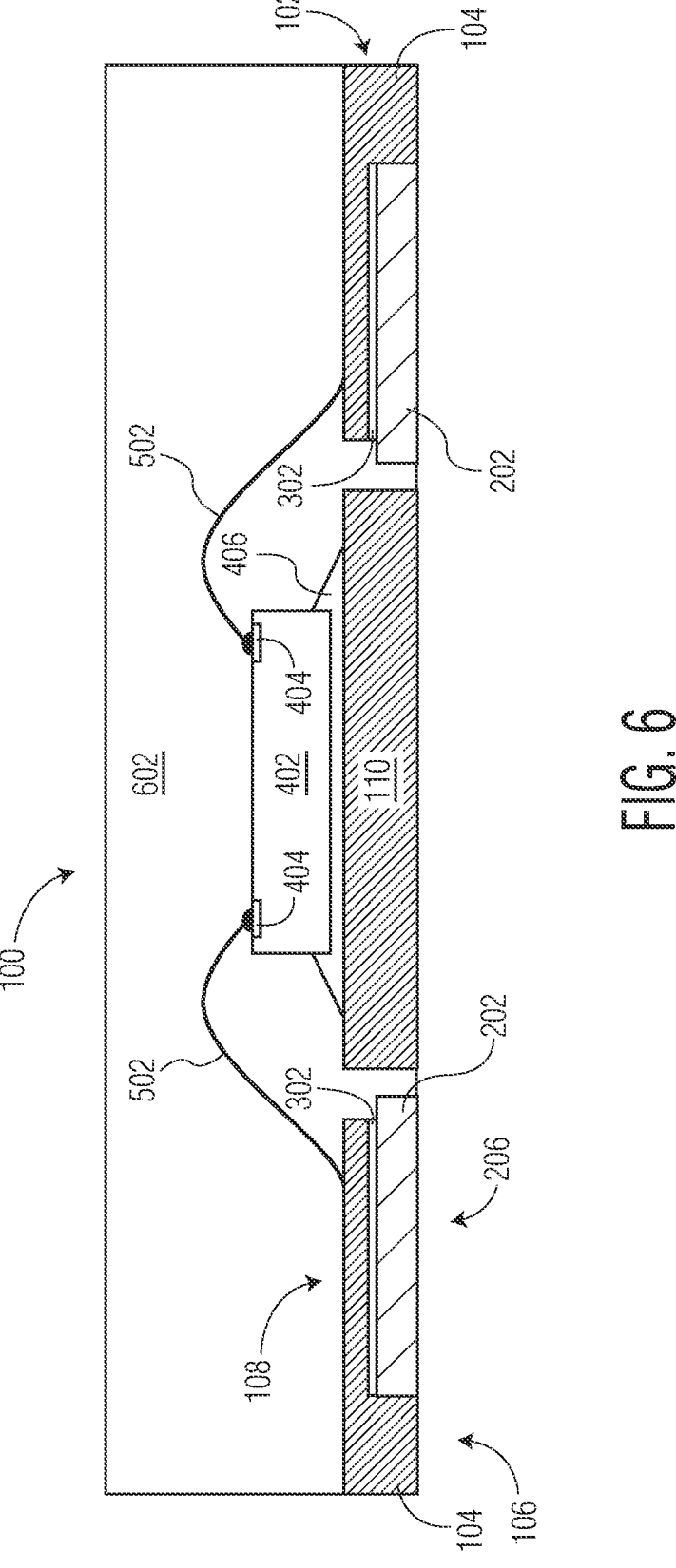

FIG. 6 illustrates, in a simplified cross-sectional view, the example semiconductor device 100 at a subsequent stage of manufacture in accordance with an embodiment. At this stage, the semiconductor device 100 depicted in FIG. 6 includes an encapsulant 602 encapsulating the semiconductor die 402 and portions of the die pad 110, leads 104, and spacer structure 202. The encapsulant 602 may be an epoxy molding compound dispensed during an injection molding encapsulation operation, for example. In this embodiment, the bottom surface of the die pad 110, bottom surface of the finger portion 206 of the spacer structure 202, and the bottom surface of the outer portion 106 of the leads 104 are substantially coplanar and may remain exposed after encapsulating with the encapsulant 602. For example, with the bottom surface of the outer portion 106 of the leads 104 and the bottom surface of the die pad 110 exposed, connection to a printed circuit board (PCB) is facilitated.

In some embodiments, when the bottom surface of the die pad 110 and bottom surface of the outer portion 106 of the leads 104 are not substantially coplanar, the semiconductor device 100 may be subjected to a subsequent back-grind operation to sufficiently expose the bottom surface of the die pad 110 and bottom surface of the outer portion 106 of the leads 104. In some embodiments, the bottom surface of the die pad 110 and bottom surface of the outer portion 106 of the leads 104 may have been pre-plated with a solderable material (e.g., silver, palladium-gold) at a stage of manufacture before encapsulating with the encapsulant 602, for example. Accordingly, the semiconductor device 100 may be singulated (e.g., from a strip or panel) when the conductive surfaces of the outer portion 106 of the leads 104 and the bottom surface of the die pad 110 are sufficiently exposed.

Figure 7:
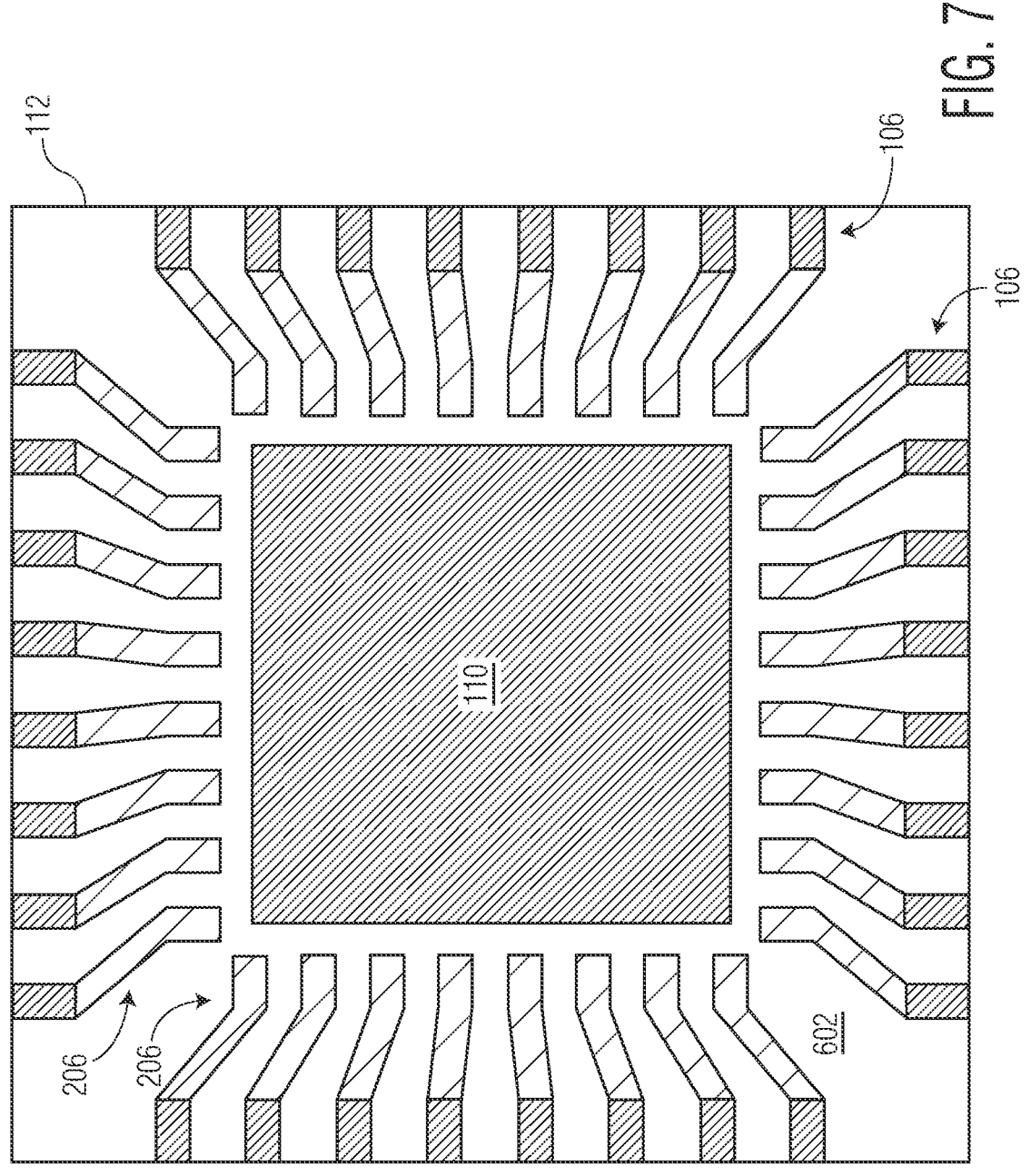
FIG. 7 illustrates, in a simplified plan view, the example semiconductor device at a final stage of manufacture in accordance with an embodiment.

FIG. 7 illustrates, in a simplified bottom-side-up plan view, the example semiconductor device 100 at a final stage of manufacture in accordance with an embodiment. At this stage, the semiconductor device 100 depicted in FIG. 7 is singulated after encapsulation and shown in a bottom-side-up orientation with an outer perimeter 112. In this embodiment, the semiconductor device 100 includes the bottom surface of the die pad 110, bottom surface of the outer portion 106 of the leads 104, and bottom surface of the finger portions 206 of the spacer structure 202 exposed after encapsulating with the encapsulant 602. Each finger portion 206 of the spacer structure is associated with a corresponding reduced thickness portion of the leads (not shown) of the leadframe. After singulation, the individual semiconductor device 100 may be subsequently connected to a PCB by way of the exposed bottom conductive surface of the outer portion 106 of the leads and the bottom surface of the die pad 110. In some embodiments, the exposed bottom surface of the die pad 110 may be configured for thermal dissipation when connected to a PCB.

Generally, there is provided, a method including affixing a spacer structure to a bottom side of a plurality of leads of a leadframe; attaching a semiconductor die to a top side of a die pad of the leadframe; and encapsulating with an encapsulant the semiconductor die, the leadframe, and the spacer structure, portions of the spacer structure and portions of the leads of the plurality of leads exposed at a bottom side of the encapsulant. Each lead of the plurality of leads may include an outer portion at a first end of the lead proximate to an outer perimeter of the leadframe and an inner portion extending from the outer portion to a second end of the lead proximate to the die pad, the outer portion having a first thickness and the inner portion having a second thickness less than the first thickness. The affixing the spacer structure spacer structure to the plurality of leads may include attaching the spacer structure to the inner portion of the leads of the plurality by way of an adhesive. After affixing the spacer structure to the plurality of leads, a bottom surface of the outer portion of the leads of the plurality and a bottom surface of the spacer structure may be substantially coplanar. The inner portion of each lead of the plurality of leads may be etched to form the second thickness. The spacer structure may include a ring portion and a plurality of finger portions, each finger portion attached to a corresponding lead of the plurality of leads. The method may further include connecting a bond pad on the semiconductor die with a first lead of the plurality of leads by way of a bond wire before encapsulating with the encapsulant. The spacer structure may be configured to support the first lead while connecting the bond pad with the first lead of the plurality of leads by way of the bond wire. The spacer structure may be formed from a non-conductive, substantially rigid material.

In another embodiment, there is provided, a semiconductor device including a leadframe including a plurality of leads and a die pad, each lead of the plurality of leads having full thickness portion and a reduced thickness portion; a spacer structure affixed to the reduced thickness portions of the plurality of leads; a semiconductor die attached to the die pad; and an encapsulant encapsulating the semiconductor die, the plurality of leads, and the spacer structure. The full thickness portion may be formed at a first end of the lead proximate to an outer perimeter of the leadframe and the reduced thickness portion may extend from the full thickness portion to a second end of the lead proximate to the die pad. The reduced thickness portion of each lead of the plurality of leads may be characterized as a half-etched portion, a bottom surface of the full thickness portion not coplanar with a bottom surface of the reduced thickness portion. The semiconductor device may further include an adhesive material disposed between the spacer structure and the reduced thickness portions of the plurality of leads. The spacer structure may include a ring portion and a plurality of finger portions, each finger portion attached to a corresponding lead of the plurality of leads. A bottom surface of the full thickness portion of the leads of the plurality and a bottom surface of the spacer structure may be substantially coplanar.

In yet another embodiment, there is provided, a semiconductor device including a leadframe including a plurality of leads substantially surrounding a die pad, each lead of the plurality of leads having full thickness portion and a reduced thickness portion; an adhesive applied on the reduced thickness portions of the plurality of leads at a bottom side; a spacer structure affixed to the reduced thickness portions of the plurality of leads by way of the adhesive; a semiconductor die attached to a top side of the die pad; and an encapsulant encapsulating at least a portion of the semiconductor die, the plurality of leads, and the spacer structure. A length of the reduced thickness portion may be greater than a length of the full thickness portion of the leads of the plurality. The spacer structure may include a plurality of finger portions, each finger portion attached to a corresponding lead of the plurality of leads. The spacer structure may be formed from a non-conductive, substantially rigid material and configured to support the reduced thickness portion of the leads of the plurality of leads during a wire bond operation. A bottom surface of the full thickness portion of the leads of the plurality and a bottom surface of the spacer structure may be substantially coplanar and exposed at a bottom side of the encapsulant.

By now it should be appreciated that there has been provided, a semiconductor device having a leadframe spacer structure. The leadframe includes a die pad and surrounding long half-etched leads. The half-etched leads have a full thickness outer portion and a reduced thickness inner portion. The spacer structure is attached at a bottom side of the inner portion of the leads by way of an adhesive material. The reduced thickness inner portion of the leads with the attached spacer structure has a total thickness substantially equal to the thickness of the full thickness outer portion. The spacer structure is formed from a non-conductive, rigid material and configured to support the long half-etched leads during a wire bonding operation, for example. A semiconductor die is attached at the top side of the die pad. Bond pads of the semiconductor die are connected to the inner portions of the leads by way of a bond wires. An encapsulant encapsulates the semiconductor die, the leadframe, and the spacer structure. A bottom surface of the full thickness outer portions of the leads and a bottom surface of the spacer structure are coplanar and exposed at a bottom side of the encapsulant. By forming the semiconductor device with the spacer structure attached to the inner portion of the long half-etched leads in this manner, the long half-etch leads are reinforced and supported during manufacturing operations (e.g., wire bonding) allowing for improved overall yields and greater reliability.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A method comprising:

affixing a spacer structure to a bottom side of a plurality of leads of a leadframe;

attaching a semiconductor die to a top side of a die pad of the leadframe; and encapsulating with an encapsulant the semiconductor die, the leadframe, and the spacer structure, portions of the spacer structure and portions of the leads of the plurality of leads exposed at a bottom side of the encapsulant;

wherein each lead of the plurality of leads includes an outer portion at a first end of the lead proximate to an outer perimeter of the leadframe and an inner portion extending from the outer portion to a second end of the lead proximate to the die pad;

wherein the spacer structure includes a ring portion and a plurality of finger portions, each finger portion attached to a corresponding lead of the plurality of leads, the ring portion is positioned proximate to outer portions of the leads of the plurality of leads and the finger portions are positioned proximate to the second ends of the leads of the plurality of leads.

2. The method of claim 1, wherein the outer portion having a first thickness and the inner portion having a second thickness less than the first thickness.

3. The method of claim 2, wherein affixing the spacer structure to the plurality of leads includes attaching the spacer structure to the inner portion of the leads of the plurality by way of an adhesive.

4. The method of claim 2, wherein after affixing the spacer structure to the plurality of leads, a bottom surface of the outer portion of the leads of the plurality and a bottom surface of the spacer structure are substantially coplanar.

5. The method of claim 2, wherein the inner portion of each lead of the plurality of leads is etched to form the second thickness.

6. The method of claim 1, further comprising connecting a bond pad on the semiconductor die with a first lead of the plurality of leads by way of a bond wire before encapsulating with the encapsulant.

7. The method of claim 6, wherein the spacer structure is configured to support the first lead while connecting the bond pad with the first lead of the plurality of leads by way of the bond wire.

8. The method of claim 1, wherein the spacer structure is formed from a non-conductive, substantially rigid material.

9. A semiconductor device comprising:

a leadframe including a plurality of leads and a die pad, each lead of the plurality of leads having full thickness portion and a reduced thickness portion, wherein the full thickness portion is formed at a first end of the lead proximate to an outer perimeter of the leadframe and the reduced thickness portion extends from the full thickness portion to a second end of the lead proximate to the die pad;

a spacer structure affixed to the reduced thickness portions of the plurality of leads;

a semiconductor die attached to the die pad; and an encapsulant encapsulating the semiconductor die, the plurality of leads, and the spacer structure;

wherein the spacer structure includes a ring portion and a plurality of finger portions, each finger portion attached to the reduced thickness portion of a corresponding lead of the plurality of leads, the ring portion is positioned proximate to the full thickness portions of the leads of the plurality of leads and the finger portions are positioned proximate to the second ends of the leads of the plurality of leads.

10. The semiconductor device of claim 9, wherein the reduced thickness portion of each lead of the plurality of leads is characterized as a half-etched portion, a bottom surface of the full thickness portion not coplanar with a bottom surface of the reduced thickness portion.

11. The semiconductor device of claim 9, further comprising an adhesive material disposed between the spacer structure and the reduced thickness portions of the plurality of leads.

12. The semiconductor device of claim 9, wherein a bottom surface of the full thickness portion of the leads of the plurality and a bottom surface of the spacer structure are substantially coplanar.

13. A semiconductor device comprising:

a leadframe including a plurality of leads substantially surrounding a die pad, each lead of the plurality of leads having full thickness portion and a reduced thickness portion, wherein the full thickness portion is formed at a first end of the lead proximate to an outer perimeter of the leadframe and the reduced thickness portion extends from the full thickness portion to a second end of the lead proximate to the die pad;

an adhesive applied on the reduced thickness portions of the plurality of leads at a bottom side;

a spacer structure affixed to the reduced thickness portions of the plurality of leads by way of the adhesive;

a semiconductor die attached to a top side of the die pad; and an encapsulant encapsulating at least a portion of the semiconductor die, the plurality of leads, and the spacer structure wherein the spacer structure includes a ring portion and a plurality of finger portions, each finger portion attached to a corresponding lead of the plurality of leads, the ring portion is positioned proximate to the full thickness portions of the leads of the plurality of leads and the finger portions are positioned proximate to the second ends of the leads of the plurality of leads.

14. The semiconductor device of claim 13, wherein a length of the reduced thickness portion is greater than a length of the full thickness portion of the leads of the plurality.

15. The semiconductor device of claim 13, wherein the spacer structure is formed from a non-conductive, substantially rigid material and configured to support the reduced thickness portion of the leads of the plurality of leads during a wire bond operation.

16. The semiconductor device of claim 13, wherein a bottom surface of the full thickness portion of the leads of the plurality and a bottom surface of the spacer structure are substantially coplanar and exposed at a bottom side of the encapsulant.

* * * * *